(12) United States Patent
Fu et al.

(10) Patent No.: US 8,637,761 B2
(45) Date of Patent: Jan. 28, 2014

(54) SOLAR CELLS FABRICATED BY USING CVD EPITAXIAL SI FILMS ON METALLURGICAL-GRADE SI WAFERS

(75) Inventors: Jianming Fu, Palo Alto, CA (US); Zheng Xu, Pleasanton, CA (US); Peijun Ding, Saratoga, CA (US); Chentao Yu, Sunnyvale, CA (US); Guanghua Song, Fremont, CA (US); Jianjun Liang, Fremont, CA (US)

(73) Assignee: Silevo, Inc., Fremont, CA (US)

( * ) Notice: Subject to any disclaimer, the term of this patent is extended or adjusted under 35 U.S.C. 154(b) by 595 days.

(21) Appl. No.: 12/343,116

(22) Filed: Dec. 23, 2008

(65) Prior Publication Data

US 2010/0065111 A1 Mar. 18, 2010

Related U.S. Application Data

(60) Provisional application No. 61/097,471, filed on Sep. 16, 2008, provisional application No. 61/102,228, filed on Oct. 2, 2008.

(51) Int. Cl.
*H01L 31/00* (2006.01)
*C30B 15/00* (2006.01)

(52) U.S. Cl.
USPC ............ 136/255; 136/258; 136/261; 117/31; 117/78; 117/79

(58) Field of Classification Search
USPC .................. 136/255, 258, 261; 117/78, 79, 21
See application file for complete search history.

(56) References Cited

U.S. PATENT DOCUMENTS

| 4,193,975 | A |   | 3/1980  | Kotval |         |
|-----------|---|---|---------|--------|---------|
| 4,200,621 | A |   | 4/1980  | Liaw   |         |
| 5,401,331 | A | * | 3/1995  | Ciszek | 136/261 |
| 5,455,430 | A |   | 10/1995 | Noguchi |        |
| 5,627,081 | A | * | 5/1997  | Tsuo et al. | 136/261 |

OTHER PUBLICATIONS

O'Mara, W.C.; Herring, R.B.; Hunt L.P. (1990). Handbook of Semiconductor Silicon Technology. William Andrew Publishing/Noyes. pp. 275-293.*
Munzer, K.A. "High Throughput Industrial In-Line Boron BSF Diffusion" Jun. 2005. 20th European Photovoltaic Solar Energy Conference, pp. 777-780.*

(Continued)

*Primary Examiner* — Jonathan Johnson
*Assistant Examiner* — Andrew Golden
(74) *Attorney, Agent, or Firm* — Shun Yao; Park, Vaughan, Fleming & Dowler LLP

(57) ABSTRACT

One embodiment of the present invention provides a method for fabricating a solar cell. The method includes: melting a metallurgical-grade (MG) Si feedstock, lowering a single-crystalline Si seed to touch the surface of the molten MG-Si, slowly pulling out a single-crystal Si ingot of the molten MG-Si, processing the Si ingot into single crystal Si wafers to form MG-Si substrates for subsequent epitaxial growth, leaching out residual metal impurities in the MG-Si substrate, epitaxially growing a layer of single-crystal Si thin film doped with boron on the MG-Si substrate, doping phosphor to the single-crystal Si thin film to form an emitter layer, depositing an anti-reflection layer on top of the single-crystal Si thin film, and forming the front and the back electrical contacts.

16 Claims, 4 Drawing Sheets

(56) References Cited

OTHER PUBLICATIONS

Warabisako, T. et al., "Efficient Solar Cells from Metallurgical-Grade Silicon", Japanese Journal of Applied Physics, Japan Society of Applied Physics, JP, vol. 19, no. suppl. 19-01, Jan. 1, 1980, pp. 539-544.

Dosaj, V. D. et al., "Single Crystal Silicon Ingot Pulled from Chemically-Upgraded Silicon", Conference Record of the IEEE Photovoltaic Specialist Conference, May 6, 1975, pp. 275-279.

Beaucarne, G. et al., "Epitaxial thin-film Si solar cells", Thin Solid Films, Elsevier-Sequoia S. A. Lausanne, vol. 511-512, Jul. 26, 2006, pp. 533-542.

Khattak, C. P. et al., "Refining Molten Metallurgical Grade Silicon for use as Feedstock for Photovoltaic Applications", 16th E.C. Photovoltaic Solar Energy Conference, May 1-5, 2000, pp. 1282-1283.

* cited by examiner

SOLAR CELLS FABRICATED BY USING CVD EPITAXIAL SI FILMS ON METALLURGICAL-GRADE SI WAFERS

RELATED APPLICATION

This application claims the benefit of U.S. Provisional Application No. 61/097,471, entitled "Solar Cells Fabricated by Using CVD Epitaxial Si Films on Metallurgical-Grade Si Wafers" by inventors Jianming Fu, Zheng Xu, Peijun Ding, Chentao Yu, Guanghua Song, and Jianjun Liang, filed 16 Sep. 2008, and U.S. Provisional Application No. 61/102,228, entitled "Solar Cells Fabricated by Using CVD Epitaxial Si Films on Metallurgical-Grade Si Wafers" by inventors Jianming Fu, Zheng Xu, Peijun Ding, Chentao Yu, Guanghua Song, and Jianjun Liang, filed 2 Oct. 2008.

BACKGROUND

1. Field of the Invention

The present invention relates to solar cells. More specifically, the present invention relates to solar cells fabricated using CVD epitaxial Si films on metallurgical-grade (MG) Si wafers.

2. Related Art

The negative environmental impact caused by the use of fossil fuels and its rising cost have resulted in a dire need for cleaner, cheaper alternative energy sources. Among different forms of alternative energy sources, solar power has been favored for its cleanness and wide availability.

A solar cell converts light into electricity using the photoelectric effect. There are several basic solar cell structures, including a single p-n junction, p-i-n/n-i-p, and multi-junction. A typical single p-n junction structure includes a p-type doped layer and an n-type doped layer of similar material. A hetero-junction structure includes at least two layers of materials of different bandgaps. A p-i-n/n-i-p structure includes a p-type doped layer, an n-type doped layer, and an optional intrinsic (undoped) semiconductor layer (the i-layer) sandwiched between the p-layer and the n-layer. A multi-junction structure includes multiple semiconductor layers of different bandgaps stacked on top of one another.

In a solar cell, light is absorbed near the p-n junction. The resulting carries diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to an electrical energy) and power collected when the solar cell is connected to an electrical circuit.

Materials that can be used to construct solar cells include amorphous silicon (a-Si), polycrystalline (poly-Si), crystalline silicon (crystalline Si), cadmium telluride (CdTe), etc. FIG. 1 illustrates an exemplary solar cell based on a crystalline-Si wafer. Solar cell 100 includes a crystalline-Si substrate 102, a p-type doped single-crystal Si layer 104, an $n^+$ silicon emitter layer 106, a front electrode 108, and an Al back electrode 110. Arrows in FIG. 1 indicate incident sunlight.

Based on industrial surveys, crystalline-Si-wafer based solar cells dominate nearly 90% of the market. However, the cost of conventional solar grade Si is well above $100/kg, which drives the cost of solar cells to $3-$4 per Watt peak (Wp). To lower the cost, various methods have been explored to utilize cheaper and lower grade Si for solar cell manufacture. Due to its cheap price, metallurgical-grade (MG) Si has been considered for making solar cells. The purity of MG-Si is usually between 98% and 99.99%. Impurities in the MG-Si include metals, boron, and phosphorus. To meet the purity requirement for high-efficiency solar cells, MG-Si needs to be purified.

U.S. Pat. No. 4,193,975 describes a method to purify MG-Si by melting Si with Al and silica slag followed by directional cooling. European Patent EP1958923A1, as well as US Patent Applications 2007/0128099A1, 2007/0202029A1, 2005/0053539A1, and 2008/0178793A1, also describe metallurgical methods for purifying Si. However, the quality of purified metallurgical Si wafers does not match that of solar-grade polysilicon, and the performance of the fabricated solar cell is less stable.

In U.S. Pat. No. 7,175,706, Mitzutani et al. of Canon describe a method for forming a high-purity polycrystalline Si thin film on MG multi-crystalline Si substrates and a corresponding method for fabricating solar cells. However, the multi-crystalline MG-Si substrate tends to produce multi-crystalline Si thin film, which results in a lower solar cell efficiency. On the other hand, T. H. Wang et al. propose a method that utilizes a liquid phase growth method for growing a high-purity silicon layer on an MG-Si substrate (see *Solar Cell Materials and Solar Cells*, vol. 41-42(1996), p. 19-30). Although a high-performance solar cell is demonstrated, the cost of liquid phase growth is prohibitively high, thus hindering any possible commercial application. Moreover, in U.S. Pat. No. 5,785,769, Ciszek proposes using an MG-Si substrate for deposition of crystalline thin-film Si. However, the boron concentration in the Ciszek MG-Si substrate is too high to form a high-efficiency solar cell.

SUMMARY

One embodiment of the present invention provides a method for fabricating a solar cell. The method includes: melting a metallurgical-grade (MG) Si feedstock, lowering a single-crystalline Si seed to touch the surface of the molten MG-Si, slowly pulling out a single-crystal Si ingot of the molten MG-Si, processing the Si ingot into single-crystal Si wafers to form MG-Si substrates for subsequent epitaxial growth, leaching out residual metal impurities in the MG-Si substrate, epitaxially growing a layer of single-crystal Si thin film doped with boron on the MG-Si substrate, doping phosphorus to the single-crystal Si thin film to form an emitter layer, depositing an anti-reflection layer on top of the single-crystal Si thin film, and forming the front and the back electrical contacts.

In a variation on this embodiment, epitaxially growing a layer of single-crystal Si thin film includes epitaxially growing a heavily boron-doped Si layer on the MG-Si substrate to form a back surface field (BSF) layer and epitaxially growing a lightly boron-doped Si layer on the heavily boron-doped Si layer.

In a further variation on this embodiment, the heavily boron-doped Si layer has a boron concentration up to $1\times10^{20}$ atoms/cm$^3$ and a thickness between 0.5 and 5 micrometers, and the lightly boron-doped Si layer has a boron concentration of approximately $4\times10^{16}$ atoms/cm$^3$ and a thickness between 20 and 100 micrometers.

In a variation on this embodiment, leaching out the residual metal impurities includes subject the MG-Si substrate to hydrogen-chloride gas.

In a variation on this embodiment, epitaxially growing the single-crystal Si thin film comprises a chemical-vapor-deposition (CVD) process.

In a further variation on this embodiment, the CVD process is performed at a temperature between 1100° C. and 1250° C.

In a variation on this embodiment, the single-crystal Si thin film has a thickness between 2 and 100 micrometers.

In a variation on this embodiment, the method further includes purifying the MG-Si feedstock using directional solidification.

In a variation on this embodiment, the MG-Si feedstock has a purity of 99.9% or better.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Overview

Embodiments of the present invention provide a solar cell based on epitaxial growth of single-crystal Si thin film on an MG-Si substrate. In one embodiment, an MG-Si substrate is obtained from an ingot grown using the Czochralski method. The MG-Si substrate is further leached out of metal impurities. A single-crystal Si thin film is grown on top of the MG-Si substrate using a CVD process. The combination of high-purity single-crystal Si thin film with relatively inexpensive MG-Si substrate makes it possible to manufacture solar modules at a low cost of approximately $1 per Wp.

Preparing MG-Si Substrate

To ensure the high efficiency of the subsequently fabricated solar cell, the starting MG-Si feedstock ideally has a purity of 99.9% or better. In the starting MG-Si feedstock, the atomic concentration of boron is between 5 ppm and 500 ppm, which corresponds to a resistivity between 0.003 ohm-cm and 0.1 ohm-cm. Note that if the boron concentration in the starting feedstock is higher than 500 ppm, the boron atoms in the resulting MG-Si substrate may diffuse into the subsequently grown single-crystal Si thin film, thus affecting the resistivity of the single-crystal Si thin film. On the other hand, the price of the MG-Si feedstock will increase dramatically if the boron concentration is less than 5 ppm, since additional purification processes will be needed.

Figure 1:
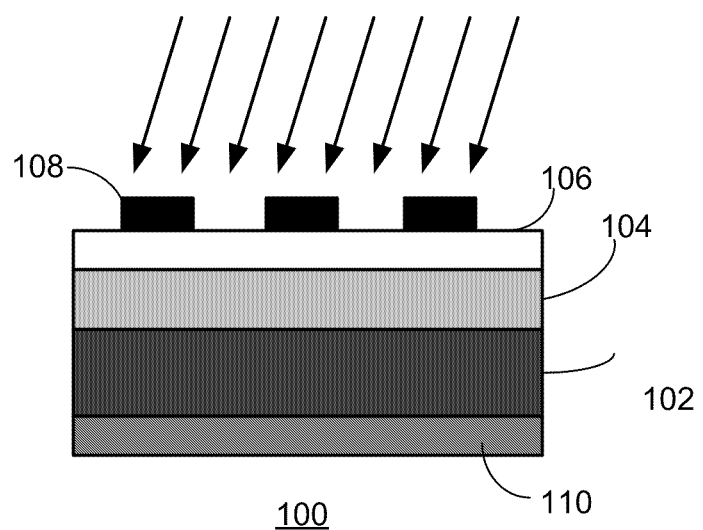
FIG. 1 illustrates the structure of an exemplary solar cell.
Figure 2:
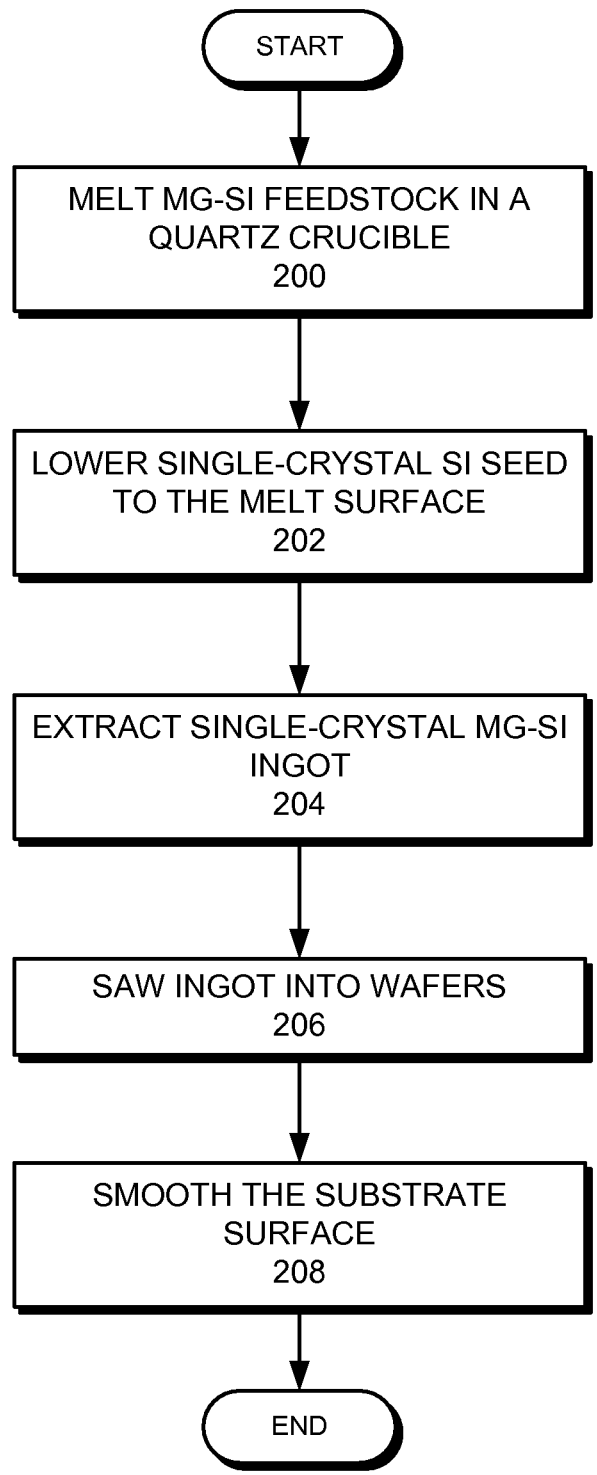
FIG. 2 presents an exemplary flow chart illustrating the process preparing an MG-Si substrate in accordance with one embodiment of the present invention.

FIG. 2 presents an exemplary flow chart illustrating the process of preparing an MG-Si substrate. The starting MG-Si feedstock is first melted in a quartz crucible, which is enclosed in an Ar-filled growth chamber (operation 200). In one embodiment, before being melted in the crucible for single crystal growth, the MG-Si feedstock goes through a directional solidification process to remove some of the impurities. The directional solidification process starts with melting the MG-Si in a crucible by heating it in an Ar environment. Then the temperature of the molten MG-Si is lowered in a way that the bottom of the melt solidifies first, and the direction of solidification is from the bottom to the top. Due to the segregation effect, the concentration of metal impurities is low in the solid and high in the liquid. As a result, the impurities tend to concentrate in the top portion. After solidification, the top portion is removed, and the purified MG-Si can be used for the subsequent single crystal growth. Note that the Si formed in this directional solidification process is polycrystalline.

During the growth of a single crystal ingot, a single-crystal Si seed, mounted on a rod, is lowered to touch the surface of the molten MG-Si (operation 202). Subsequently, the seed crystal's rod is pulled upward and rotated at the same time to extract a large, single-crystal, cylindrical ingot from the molten MG-Si (operation 204). The ingot is then sawed into wafers to form MG-Si substrates (operation 206). Various methods can be used to saw the ingot to form substrate wafers. In one embodiment, the ingot is sawed into substrates wafers using a standard wire saw. Finally, the surface of the MG-Si substrate is polished using various techniques including, but not limited to: chemical-mechanical polishing (CMP), chemical polishing (CP), and simple lapping (operation 208).

Due to the segregation effect, during the growth of the ingot, metal impurities in the MG-Si feedstock tend to stay in the melt. The segregation coefficient, which is the ratio of an impurity in the solid phase to that in the liquid phase, can be as low as $8e\text{-}6$ for killing-defect metals, such as iron. Therefore, upon the completion of the Si ingot growth, the tail of the ingot and the Si left in the crucible have a higher impurity concentration, and will be removed. Such an ingot growth process can remove a significant amount of metal impurities from the remaining ingot, which may have a metal impurity level below $1e16/cm^3$.

Growing Single-Crystal Si Thin Film

Prior to the growth of a single-crystal Si thin film, the MG-Si substrate is baked at a temperature between 1100° C. and 1250° C. in a chemical-vapor-deposition (CVD) chamber filled with hydrogen ($H_2$) in order to remove native silicon-oxide in the substrate. Afterwards, under the same temperature, hydrogen chloride (HCl) gas is introduced inside the CVD chamber to leach out any residual metal impurities from the MG-Si substrate, thus further preventing the impurities from diffusing into the subsequently grown single-crystal Si thin film. Due to the fact that metal impurities, such as iron, have a high diffusion coefficient at this temperature, the metal impurities tend to migrate to the surface of the substrate, and react with the HCl gas to form volatile chloride compounds. The volatile chloride compounds can be effectively purged from the chamber using a purge gas, such as $H_2$. Note that the metal-impurity leaching process can be carried out either in the CVD chamber, which is subsequently used for the growth of the single-crystal Si thin film, or in another stand-alone furnace. The metal-impurity leaching process can take between 1 minute and 120 minutes.

Various methods can be used to epitaxially grow a single-crystal Si thin film on the MG-Si substrate. In one embodiment, the single-crystal Si thin film is grown using a CVD process. Various types of Si compounds, such as $SiH_4$, $SiCl_4$, $SiH_2Cl_2$, and $SiHCl_3$, can be used in the CVD process to form a single-crystal Si thin film. In one embodiment, $SiHCl_3$ (TCS) is used due to its abundance and low cost. During the CVD process, the precursor TCS gas is reduced to Si using hydrogen at high temperature, resulting in a single-crystal Si thin film deposited on the MG-Si substrate. In the process, boron is also added so that the single-crystal Si thin film is p-type doped. In one embodiment, the resistivity of the p-type doped single-crystal Si thin film is between 0.2 and 5 ohm-cm. The temperature for the CVD process can be between 1100° C. and 1250° C. The thickness of the CVD single-crystal Si thin film can be between 2 and 100 micrometers. In one embodiment, the thickness of the CVD single-crystal Si thin film is between 5 and 50 micrometers. Note that for a solar cell, a lower Si film thickness reduces its light absorption, thus lowering efficiency, whereas a higher film thickness increases its production cost.

After the growth of the p-type doped single-crystal Si thin film, a conventional solar cell fabrication process is followed. In one embodiment, the p-type doped single-crystal Si thin film is further doped with phosphorus in a diffusion furnace to form an n-type doped emitter layer. To enhance light absorption, in one embodiment, a SiNx anti-reflection coating is deposited on top of the emitter layer using a plasma-enhanced CVD (PECVD) technique. In addition, an Al back electrode and an Ag front grid are screen-printed on the front and back sides of the solar cell to form the front and back electrical contacts. In one embodiment, the front and back electrodes are co-fired in a belt-furnace.

Figure 3:
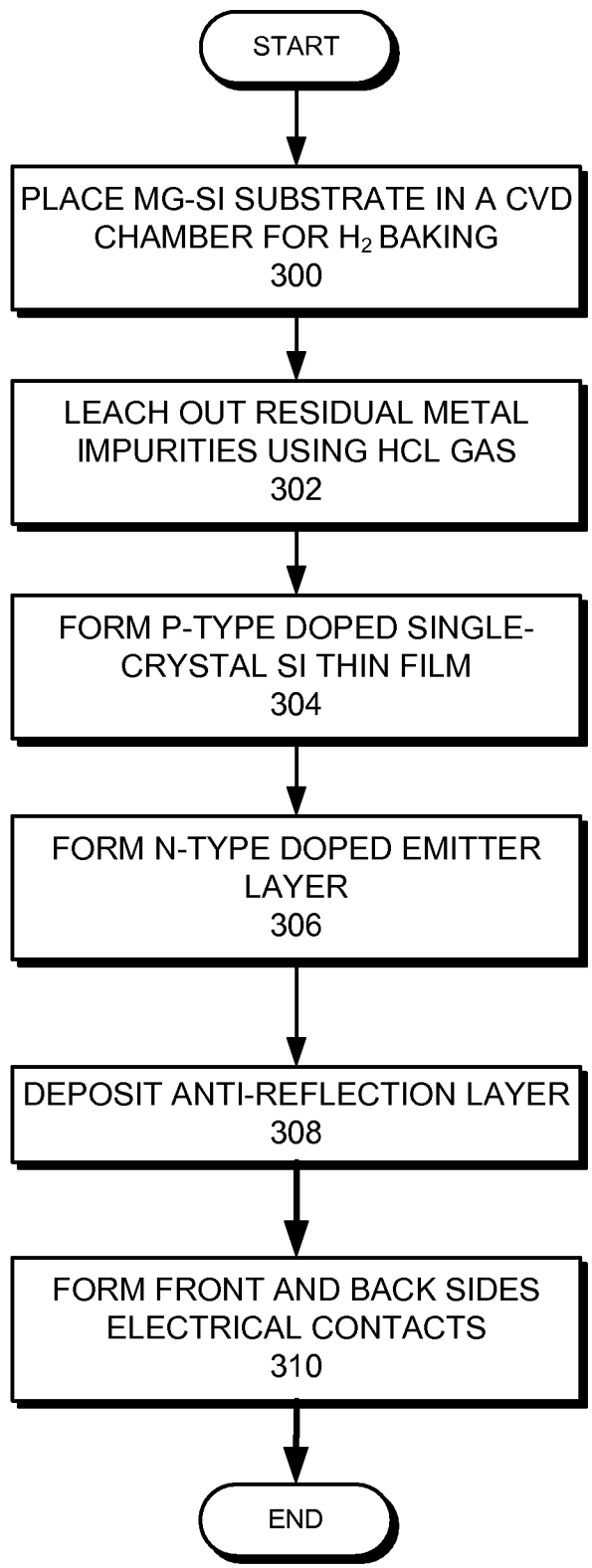
FIG. 3 presents an exemplary flow chart illustrating the process of fabricating a solar cell based on an MG-Si substrate in accordance with one embodiment of the present invention.

FIG. 3 presents an exemplary flow chart illustrating the process of fabricating a solar cell on an MG-Si substrate in accordance with one embodiment of the present invention. During operation, the MG-Si substrate is placed in a CVD chamber for $H_2$ baking (operation 300). Then, the CVD chamber is filled with HCl gas to leach out residual metal impurities (operation 302). Subsequently, a p-type doped single-crystal Si thin film is formed using a CVD technique (operation 304). The p-type doped single-crystal Si thin film is later doped with phosphorus to form an n-type doped emitter layer (operation 306). Afterwards, an anti-reflection coating is deposited (operation 308). Finally, the front and back electrical contacts are formed (operation 310).

Figure 4:
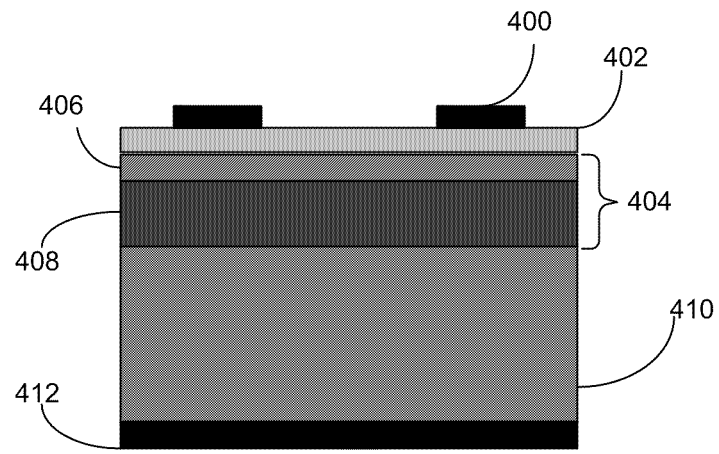
FIG. 4 illustrates the structure of a solar cell based on an MG-Si substrate in accordance with the present invention.

FIG. 4 illustrates an exemplary solar cell structure in accordance with one embodiment of the present invention. FIG. 4 illustrates, from top down, front electrodes 400, an anti-reflection layer 402, a single-crystal Si thin film 404 including an n-type doped emitter layer 406 and a p-type doped layer 408, an MG-Si substrate 410, and a back electrode 412.

To improve the performance of the solar cell, in one embodiment, two layers of single-crystal Si thin film are grown on the MG-Si substrate. First, a heavily boron-doped single-crystal Si thin film, with a doping concentration of up to $1\times10^{20}$ atoms/$cm^3$, is epitaxially grown on the MG-Si substrate to form a back surface field (BSF) layer. The BSF layer decreases the effective minority-carrier-recombination rate at the back surface, thus enhancing the solar cell performance. Subsequently, a lightly boron-doped single-crystal Si thin film, with a doping concentration of approximately $4\times10^{16}$ atoms/$cm^3$, is grown on top of the heavily doped layer. The thickness of the heavily doped layer can be between 0.5 and 5 micrometers, and the thickness of the lightly doped layer can be between 20 to 100 micrometers.

Figure 5:
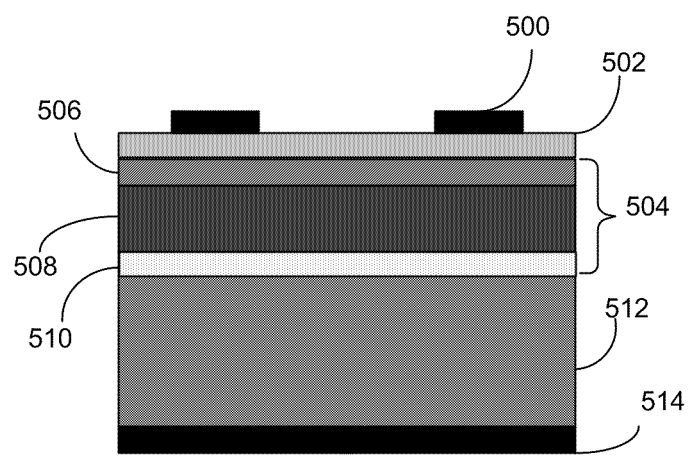
FIG. 5 illustrates the structure of a solar cell based on an MG-Si substrate in accordance with the present invention.

FIG. 5 illustrates an exemplary solar cell structure in accordance with one embodiment of the present invention. FIG. 5 illustrates, from top down, front electrodes 500, an anti-reflection layer 502, a single-crystal Si thin film 504 including an n-type doped emitter layer 506, a lightly boron-doped layer 508, and a BSF layer 510, an MG-Si substrate 512, and a back electrode 514.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for fabricating a solar cell, the method comprising:
    purifying a metallurgical-grade (MG) Si feedstock using a directional solidification process;
    melting the purified MG-Si feedstock;
    lowering a single-crystal Si seed to touch the surface of the molten MG-Si;
    slowly pulling a single-crystal Si ingot out of the molten MG-Si;
    processing the Si ingot into wafers to form a plurality of MG-Si substrates for subsequent epitaxial growth, wherein a respective MG-Si substrate has a metal impurity level below $1e16/cm^3$;
    creating a plurality of pores on an upper surface of the MG-Si substrate to form a porous-Si layer, wherein the porous-Si layer has a porosity of less than 20%;
    leaching out residual metal impurities in the MG-Si substrate, wherein leaching out the residual metal impurities involves using HCl gas to react with the residual metal impurities;
    epitaxially growing a layer of single-crystal Si thin film doped with boron on top of the porous-Si layer;
    doping phosphorus into the single-crystal Si thin film to form an emitter layer;
    depositing an anti-reflection layer on top of the single-crystal Si thin film; and
    forming front and the back electrical contacts.

2. The method of claim 1, wherein epitaxially growing a layer of single-crystal Si thin film comprises:
    epitaxially growing a heavily boron-doped Si layer on the upper surface of the MG-Si substrate to form a back surface field (BSF) layer; and
    epitaxially growing a lightly boron-doped Si layer on the heavily boron-doped Si layer.

3. The method of claim 2, wherein the heavily boron-doped Si layer has a boron concentration up to $1\times10^{20}$ atoms/$cm^3$ and a thickness between 0.5 and 5 micrometers, and wherein the lightly boron-doped Si layer has a boron concentration up to $4\times10^{16}$ atoms/$cm^3$ and a thickness between 20 and 100 micrometers.

4. The method of claim 1, wherein epitaxially growing the single-crystal Si thin film comprises a chemical-vapor-deposition (CVD) process.

5. The method of claim 4, wherein the CVD process is performed at a temperature between 1100° C. and 1250° C.

6. The method of claim 1, wherein the single-crystal Si thin film has a thickness between 2 and 100 micrometers.

7. The method of claim 1, wherein the MG-Si feedstock has a purity of 99.9% or better.

8. A solar cell fabricated using a metallurgical-grade (MG) Si wafer as a substrate, the solar cell comprising:
    an MG-Si substrate, wherein the MG-Si substrate includes a porous layer having a porosity of less than 20%, wherein the MG-Si substrate has a metal impurity level below $1e16/cm^3$, and wherein the MG-Si substrate is formed using a method comprising:
        purifying a metallurgical-grade (MG) Si feedstock using a directional solidification process;
        melting the purified MG-Si feedstock;
        slowly pulling a single-crystal Si ingot out of the molten MG-Si;

processing the Si ingot into wafers to form a plurality of MG-Si substrates for subsequent epitaxial growth;

forming a plurality of pores on upper surfaces of the MG-Si substrates to form the porous-Si layer; and leaching out residual metal impurities in the MG-Si substrates, wherein leaching out the residual metal impurities involves using HCl gas to react with the residual metal impurities;

a p-type doped single-crystal Si thin film situated directly on top of the porous-Si layer;

an n-type doped single-crystal Si thin film situated above the p-type doped Si thin film;

an anti-reflection layer situated above the n-type doped single-crystal Si thin film;

a back metal layer situated below the MG-Si substrate; and a front electrode situated above the anti-reflection layer.

9. The solar cell of claim 8, wherein the p-type doped single-crystal Si thin film comprises a heavily boron-doped Si layer as a BSF layer situated above the MG-Si substrate and a lightly boron-doped Si layer situated above the heavily boron-doped Si layer.

10. The solar cell of claim 9, wherein the heavily boron-doped Si layer has a boron concentration up to $1 \times 10^{20}$ atoms/cm$^3$ and a thickness between 0.5 and 5 micrometers, and wherein the lightly boron-doped Si layer has a boron concentration up to $4 \times 10^{16}$ atoms/cm$^3$ and a thickness between 20 and 100 micrometers.

11. The solar cell of claim 8, wherein the p-type doped single-crystal Si thin film is epitaxially grown using a chemical-vapor-deposition (CVD) process.

12. The solar cell of claim 11, wherein the CVD process is performed at a temperature between 1100° C. and 1250° C.

13. The solar cell of claim 8, wherein the p-type doped single-crystal Si thin film has a thickness between 2 and 100 micrometers.

14. The solar cell of claim 8, wherein the MG-Si feedstock has a purity of 99.9% or better.

15. The method of claim 1, wherein leaching out the residual metal impurities comprises subjecting the MG-Si substrate to hydrogen-chloride gas at a temperature higher than 800° C.

16. The method of claim 1, further comprising chemically polishing the MG-Si substrate in liquid chemicals to achieve a smooth surface before epitaxial deposition of Si film.

* * * * *